(12) United States Patent
Kim et al.

(10) Patent No.: US 9,466,609 B2
(45) Date of Patent: Oct. 11, 2016

(54) 3-DIMENSIONAL NONVOLATILE MEMORY DEVICE AND METHOD OF MANUFACTURING THE SAME

(71) Applicant: SK hynix Inc., Gyeonggi-do (KR)

(72) Inventors: Min Soo Kim, Gyeonggi-do (KR); Dong Sun Sheen, Gyeonggi-do (KR); Young Jin Lee, Gyeonggi-do (KR); Jin Hae Choi, Gyeonggi-do (KR); Joo Hee Han, Seoul (KR); Sung Jin Whang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 14/540,824

(22) Filed: Nov. 13, 2014

(65) Prior Publication Data
US 2015/0072491 A1 Mar. 12, 2015

Related U.S. Application Data

(62) Division of application No. 13/603,049, filed on Sep. 4, 2012, now abandoned.

(30) Foreign Application Priority Data

Oct. 25, 2011 (KR) .................. 10-2011-0109479

(51) Int. Cl.
| | | |
|---|---|---|
| H01L 27/115 | (2006.01) |
| H01L 29/66 | (2006.01) |
| H01L 29/788 | (2006.01) |
| H01L 29/792 | (2006.01) |
| H01L 21/28 | (2006.01) |
| H01L 21/283 | (2006.01) |
| H01L 21/311 | (2006.01) |
| H01L 21/3213 | (2006.01) |
| H01L 29/423 | (2006.01) |

(52) U.S. Cl.
CPC ....... *H01L 27/11582* (2013.01); *H01L 21/283* (2013.01); *H01L 21/28282* (2013.01); *H01L 21/31111* (2013.01); *H01L 21/32134* (2013.01); *H01L 21/32135* (2013.01); *H01L 27/11556* (2013.01); *H01L 29/42344* (2013.01); *H01L 29/66825* (2013.01); *H01L 29/66833* (2013.01); *H01L 29/7889* (2013.01); *H01L 29/7926* (2013.01)

(58) Field of Classification Search
USPC .................................. 365/185.17
See application file for complete search history.

(56) References Cited

U.S. PATENT DOCUMENTS

2010/0120214 A1* 5/2010 Park ............... H01L 27/11578
 438/287
2011/0298037 A1* 12/2011 Choe ............... G11C 16/0483
 257/324

* cited by examiner

*Primary Examiner* — Mohammad Islam
*Assistant Examiner* — Ratisha Mehta
(74) *Attorney, Agent, or Firm* — IP & T Group LLP

(57) ABSTRACT

The device includes plural control gates stacked on a substrate, plural first channels, configured to penetrate the control gates, and plural memory layer patterns, each located between the control gate and the first channel, configured to respectively surround the first channel, wherein the memory layer patterns are isolated from one another.

12 Claims, 12 Drawing Sheets

3-DIMENSIONAL NONVOLATILE MEMORY DEVICE AND METHOD OF MANUFACTURING THE SAME

CROSS-REFERENCE TO RELATED APPLICATION

This application is a division of U.S. patent application Ser. No. 13/603,049 filed on Sep. 4, 2012, which claims priority to and the benefit of Korean Patent Application No. 10-2011-0109479, filed on Oct. 25, 2011. The disclosure of each of the foregoing application is incorporated herein by reference in its entirety.

BACKGROUND

The present invention relates to a semiconductor device and a method of manufacturing the same. More specifically, the present invention relates to a 3-dimensional nonvolatile memory device and a method of manufacturing the same.

A nonvolatile memory device is a kind of memory device, which is capable of intactly retaining stored data without power supply. As a two-dimensional memory device manufactured as a single layer on a silicon substrate may be reaching a technical limit for increasing integration density, a three-dimensional nonvolatile memory device, which includes memory cells vertically stacked on a silicon substrate has been proposed recently.

Hereinafter, some concerns in conventional three-dimensional nonvolatile memory devices will be described in detail, with reference to the drawings.

FIG. 1 is a cross-sectional view of a conventional 3-dimensional nonvolatile memory device.

Referring to FIG. 1, the conventional 3-dimensional nonvolatile memory device may include channels CH protruding from a substrate 10 and a plurality of memory cells MC stacked along the channels CH. Also, the memory device may further include a lower selection gate LSG formed under the plurality of memory cells MC and an upper selection gate USG formed on the plurality of memory cells MC. Bit lines BL may be provided on the upper selection gate USG. The bit lines BL are connected to the channels CH. In the above-described structure, a plurality of memory cells MC connected in series between the lower selection gate LSG and the upper selection gate USG may constitute one string STRING, which may locate vertically on the substrate 10.

In FIG. 1, reference numerals 11, 14, and 17 denote interlayer insulating layers. A reference numeral 12 denotes a lower selection line. Reference numeral 15 denotes a word line. A reference numeral 18 denotes an upper selection line. Also, reference numerals 13 and 19 denote gate insulating layers. A reference numeral 16 denotes a charge blocking layer, a charge trap layer, and a tunnel insulating layer.

A method of forming the memory cells CH is briefly described. A plurality of conductive layers 15 and a plurality of interlayer insulating layers 14 may be alternately formed and etched in order to form trenches. Thereafter, a charge blocking layer, a charge trap layer, and a tunnel insulating layer 16 may be formed on inner walls of the trenches. A channel layer may be formed in the trenches. Due to the above-described manufacturing process, charge trap layers of the plurality of memory cells MC stacked along the channels CH may be connected to one another.

Here, the charge trap layer may serve as a substantial data storage where data is stored by injecting or emitting charges. In the conventional structure where the charge trap layers of the memory cells MC are connected to one another, charges stored in one memory cell MC may be moved or transported to another memory cell MC so that stored data may be changed or damaged.

SUMMARY OF THE INVENTION

The present invention is directed to a 3-dimensional nonvolatile memory device, which is capable of improving data retention characteristics and a method of manufacturing the same.

One aspect of the present invention provides a nonvolatile memory device including plural control gates stacked on a substrate, plural first channels, configured to penetrate the control gates, and plural memory layer patterns, each located between the control gate and the first channel, configured to respectively surround the first channel, wherein the memory layer patterns are isolated from one another.

Another aspect of the present invention provides a method of manufacturing a nonvolatile memory device. The method includes alternately forming first material layers and second material layers, etching the first material layers and the second material layers to form first trenches, etching the second material layers exposed in the first trenches, forming a charge trap layer along inner surfaces of the first trenches in which the second material layers are etched, forming a channel layer on the charge trap layer to form first channels having protrusions protruding between the stacked first material layers, etching the first material layers and the second material layers to form slits between adjacent first trenches, etching the charge trap layer exposed to inner walls of the slits to isolate the charge trap layer of stacked memory cells from one another, and forming an insulating layer in the slits in which the charge trap layer is etched.

Another aspect of the present invention provides a method of manufacturing a nonvolatile memory device. The method includes alternately forming conductive layers and first sacrificial layers; etching the conductive layers and the first sacrificial layers to form first trenches; forming a charge trap layer along inner surfaces of the first trenches; forming a channel layer on the charge trap layer to form first channels protruding from a substrate; etching the conductive layers and the second sacrificial layers to form slits between adjacent first trenches; etching the first sacrificial layers exposed in the slits to expose the charge trap layer; etching the charge trap layer exposed in the slits to isolate the charge trap layer of stacked memory cells from one another; forming junctions in the first channels exposed by etching the charge trap layer; and forming an insulating layer in the slits.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1:
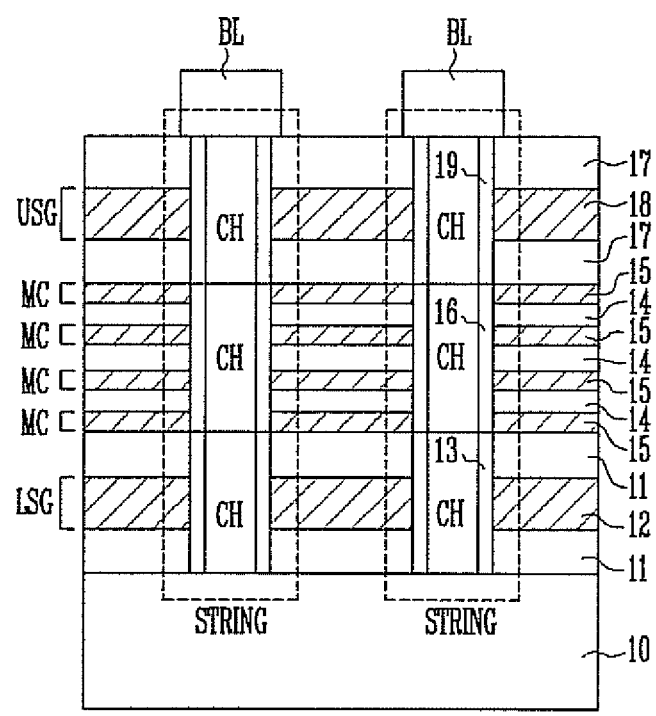
FIG. 1 is a cross-sectional view of a structure of a conventional 3-dimensional nonvolatile memory device.

The present invention will be described more fully hereinafter with reference to the accompanying drawings, in which exemplary embodiments of the invention are shown. In the drawings, thicknesses and intervals are illustrated for brevity and may be exaggerated with respect to actual physical thicknesses. Descriptions of well-known components and processing techniques irrelevant to the embodiments of the present invention may be omitted. The same or similar numbers may be described with reference to other drawings even if they are neither mentioned nor described in the corresponding drawing. Also, even elements that are not denoted by reference numbers may be described with reference to other drawings.

FIGS. 2A through 2F are cross-sectional views illustrating a method of manufacturing a 3-dimensional nonvolatile memory device according to a first exemplary embodiment of the present invention. For brevity, only a memory cell region is illustrated in FIGS. 2A through 2F.

Figure 2A:
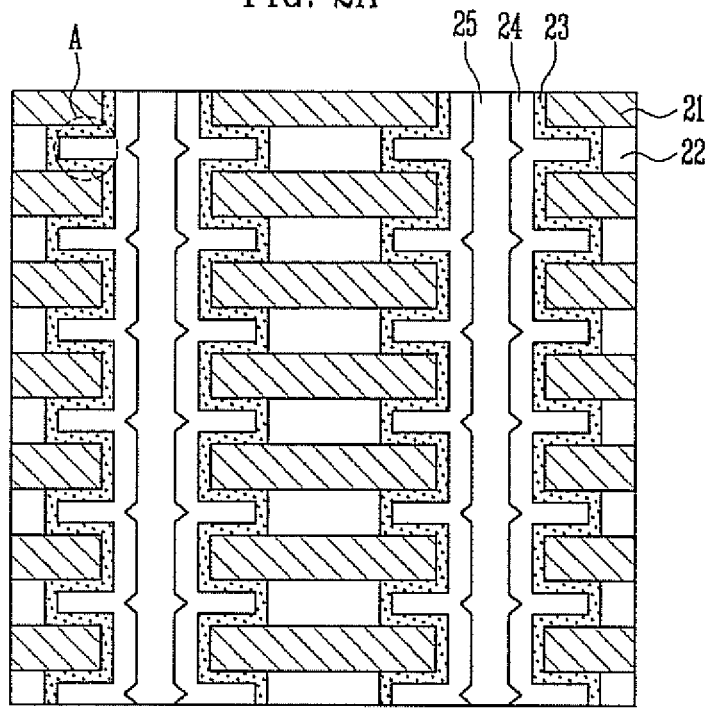
FIGS. 2A through 2F are cross-sectional views illustrating a method of manufacturing a 3-dimensional nonvolatile memory device according to a first exemplary embodiment of the present invention.

Referring to FIG. 2A, a plurality of first material layers 21 and a plurality of second material layers 22 may be alternately formed.

Here, forming the first material layers 21 may be to form control gates, while the second material layers 22 may be formed to form interlayer insulating layers configured to isolate stacked control gates from one another. Accordingly, the numbers of the stacked first material layers 21 and second material layers 22 may be determined by the number of memory cells to be stacked.

The first material layers 21 and the second material layers 22 may be formed of materials having different etch selectivity ratios. Herein, the first material layers 21 may be a conductive layer for control gates, while the second material layers 22 may be a sacrificial layer. Otherwise, the first material layers 21 may be a sacrificial layer, while the second material layers 22 may be an interlayer insulating layer. In the first embodiment, the first material layers 21 are sacrificial layers such as a nitride layer. The second material layers 22 are interlayer insulating layers, such as an oxide layer.

Thereafter, the plurality of first material layers 21 and plurality of second material layers 22 may be etched to form a plurality of first trenches. The plurality of second material layers 22 exposed to inner walls of the first trenches may be etched by a partial thickness.

Thereafter, a memory layer 23 may be formed along inner surfaces of the first trenches formed by a process of etching the plurality of second material layers 22 by the partial thickness. Here, the memory layer 23 may include a charge blocking layer, a charge trap layer, and a tunnel insulating layer. However, according to an embodiment, only the charge trap layer and the tunnel insulating layer, except for the charge blocking layer, may be formed.

Subsequently, a channel layer may be formed on the memory layer 23, thereby forming first channels 24 through the stacked first material layers 21 and second material layers 22. Here, forming the channel layer on the inner walls of the first trenches may be to fill into regions obtained by a process of etching the plurality of second material layers 22 by the partial thickness. Accordingly, the first channels 24 may include a plurality of protrusions 'A', each protruding between the stacked first material layers 21.

Here, forming the channel layer to such a thickness may be to completely fill central regions of the first trenches or open the central regions of the first trenches. When the central regions are opened, i.e., the channel layer does not pack into the first trenches, an insulating layer 25 may be formed on the opened central regions.

Figure 2B:
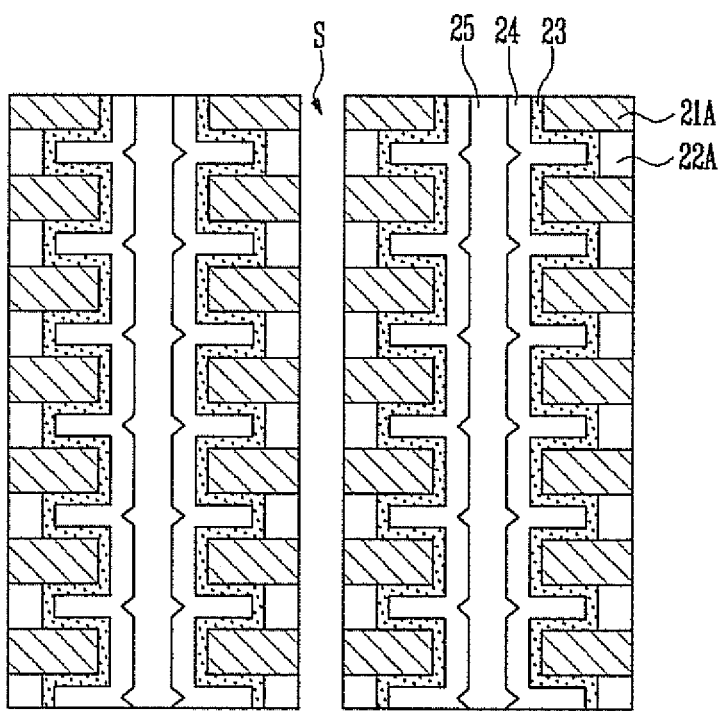

Referring to FIG. 2B, the plurality of first material layers 21 and the plurality of second material layers 22 may be etched to form slits S between adjacent first channels 24. In FIG. 2B, a reference numeral 21A denotes etched first material layers. A reference numeral 22A denotes etched second material layers. Although FIG. 2B illustrates that the plurality of second material layers 22A partially remain after a step of forming the slits 'S,' the plurality of second material layers 22 may be wholly removed.

Figure 2C:
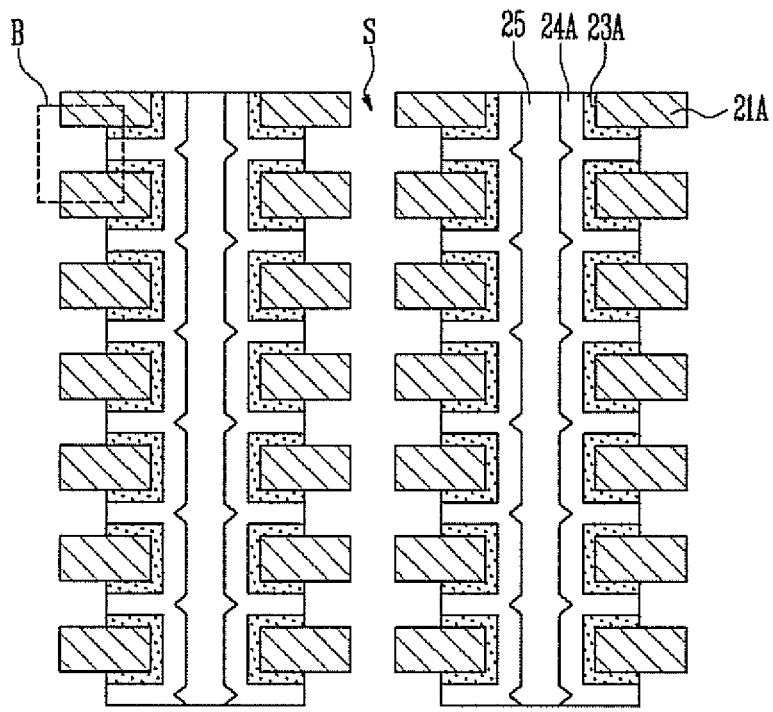

Referring to FIG. 2C, the memory layer 23 may be exposed by removing the remaining second material layers 22A. The memory layer 23 exposed in the slits S may be etched (refer to reference character "B"). In this case, since the protrusions 'A' locates between the first material layers 21A, the collapse of the first material layers 21A may not occur. Further, the memory layer 23 may be easily etched.

As a result, the memory layer 23 may be patterned into a plurality of memory layer patterns 23A. The charge trap layers of the memory cells stacked along the first channels 24 may be isolated from one another. Accordingly, the transport of charges between the stacked memory cells may not occur.

Although not shown in FIG. 2C, impurities may be implanted into the protrusions 'A' of the first channels 24 exposed by etching the memory layer 23, thereby forming junctions. In this case, adjusting a doping depth of the impurities may control the depth of the junctions.

Figure 2D:
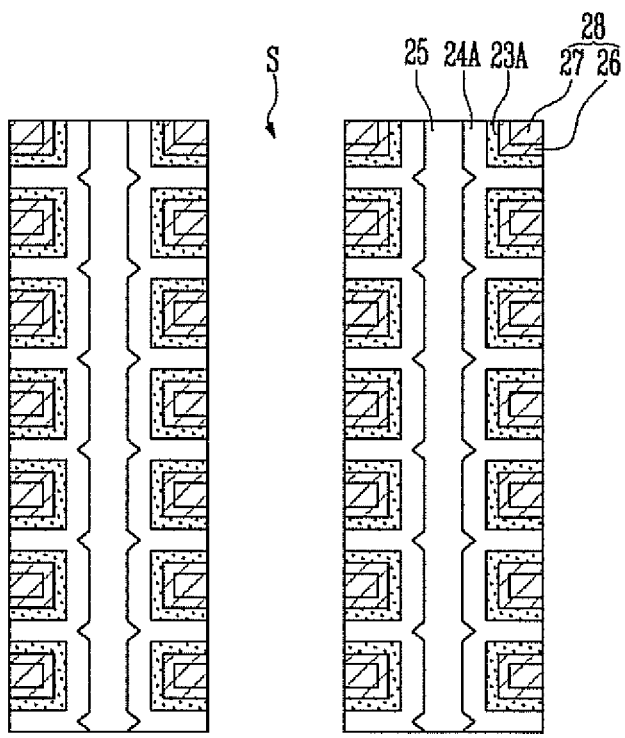

Referring to FIG. 2D, the plurality of first material layers 21A exposed in the slits 'S' may be removed to form a plurality of control gate regions. In this case, the plurality of protrusions 'A' may function as molds for control gates. Regions between the protrusions may become the control gate regions.

Thereafter, depositing a conductive layer in the plurality of control gate regions may be to form a plurality of control gates 28. For example, a first metal layer 26 may be formed along the inner surfaces of the slits 'S' including the plurality of control gate regions. Forming second metal layer 27 on the first metal layer 26 may be to fill the control gate regions. Here, the first metal layer 26 may be a barrier metal layer. The second metal layer 27 may be a gap-fill metal layer.

Afterwards, the second metal layer 27 formed on the inner walls of the slits 'S' except the plurality of control gate regions may be etched by a combination of a wet etching process and a dry etching process. Thereafter, a cleaning process may etch the first metal layer 26 formed on the inner walls of the slits S except the plurality of control gate regions. As a result, the conductive layer formed in the plurality of control gate regions may be separated into the plurality of control gates 28.

When only the charge trap layer and the tunnel insulating layer are formed during the formation of the memory layer 23 as described above, a charge blocking layer may be formed before forming the control gates 28.

Figure 2E:
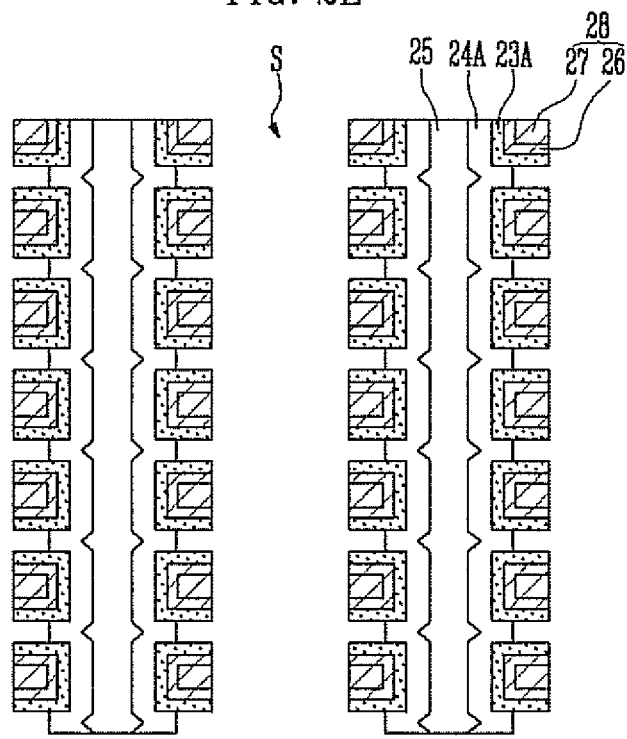

Referring to FIG. 2E, a plurality of protrusions protruding between the stacked control gates 28 may be etched. In FIG. 2E, a reference numeral 24A denotes first channels having etched protrusions.

When the protrusions are etched, the effective length of a channel of each of the memory cells may be reduced. Naturally, the protrusions may be partially etched or may not be etched but remain. In addition, after etching the protrusions, junctions may be formed in the first channels 24A between the stacked control gates 28.

Figure 2F:
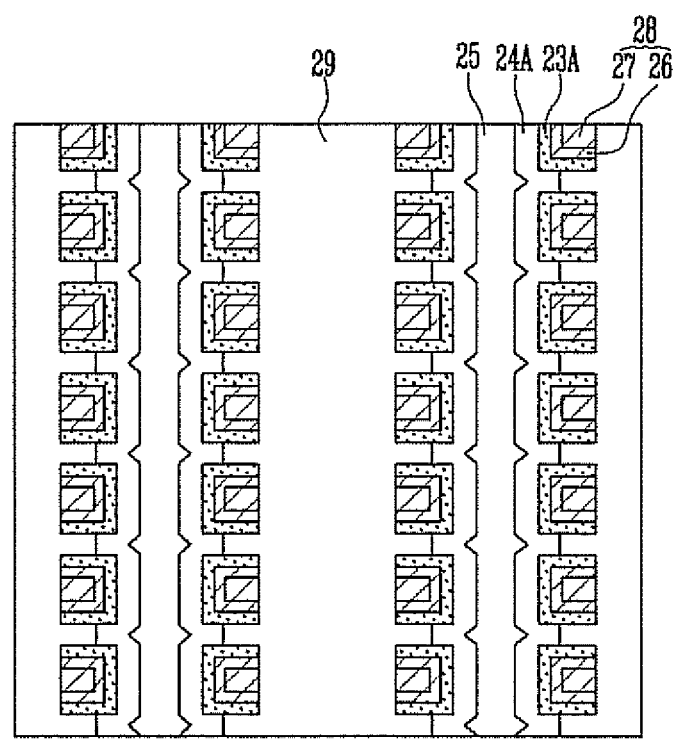

Referring to FIG. 2F, an insulating layer may be formed in the slits S in which the plurality of protrusions are etched. Thus, a plurality of memory cells stacked along the first channels 24A may be formed. In particular, according to the first embodiment, angled C shaped memory layer patterns 23A may respectively surround the control gates 28. That is, the memory layer patterns 23A may locate between the first channels 24A and the plurality of control gates 28 to surround top and bottom surfaces of the plurality of control gates 28. Accordingly, the plurality of memory cells stacked along the first channels 24A may include the isolated charge trap layers, respectively.

In the first embodiment, the first material layers 21 may be formed as a conductive layer for control gates, such as a doped polysilicon (doped poly-Si) layer or a doped amorphous silicon layer, while the second material layer 22 may be formed as a sacrificial layer such as an undoped poly-Si layer or an undoped amorphous silicon layer. Here, the term "doped" means being doped with a dopant, such as boron (B), and "undoped" means being not doped with a dopant.

In this case, after performing the processes described with reference to FIGS. 2A through 2C, an insulating layer may be formed in the slits 'S.' The formation the memory cells stacked along the first channels 24 may be completed. In this case, before forming the insulating layer, the plurality of first material layers 21 exposed in the slits S may be silicided. For example, the silicidation of the first material layers 21 may include forming a metal layer in the slits 'S,' siliciding the first material layers 21 using an annealing process, and removing the remaining metal layer. Before forming the insulating layer, junctions may be formed in the protrusions protruding between the stacked first material layers 21, the protrusions may be etched, or junctions may be formed in the first channels 24 between the stacked first material layers 21 after etching the protrusions.

FIGS. 3A through 3D are cross-sectional views illustrating a method of manufacturing a 3-dimensional nonvolatile memory device according to a second embodiment of the present invention.

The second embodiment pertains to a method of forming control gates by forming additional molds after etching protrusions of first channels. Hereinafter, a description of the same processes as in the first embodiment will be omitted.

Figure 3A:
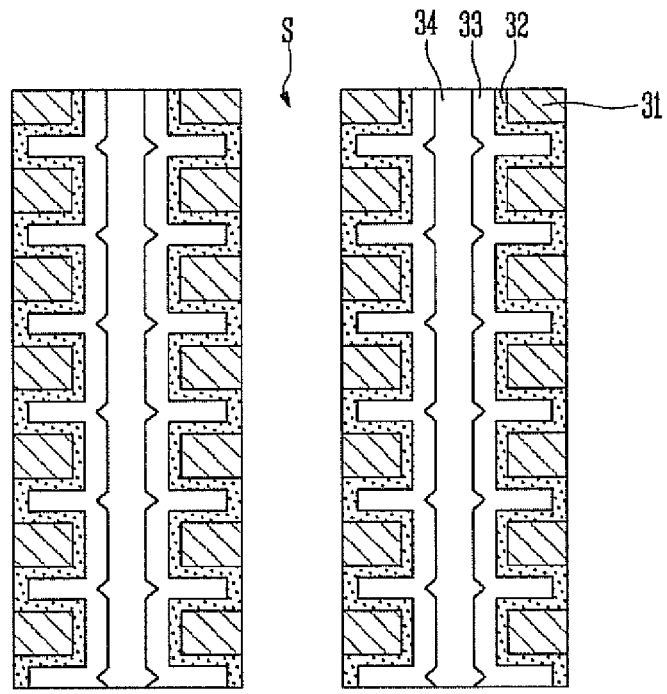
FIGS. 3A through 3D are cross-sectional views illustrating a method of manufacturing a 3-dimensional nonvolatile memory device according to a second exemplary embodiment of the present invention.

Referring to FIG. 3A, first channels 33 including a plurality of protrusions may be formed through a plurality of first material layers 31. A memory layer 32 may locate between the first channels 33 and a plurality of control gates 31 to surround the first channels 33. Slits 'S' may be formed between adjacent first channels 34. Here, depositing the first material layers 31 may be to form a sacrificial layer, such as a nitride layer, while the second material layers 32 may be formed as an interlayer insulating layer, such as an oxide layer.

Figure 3B:
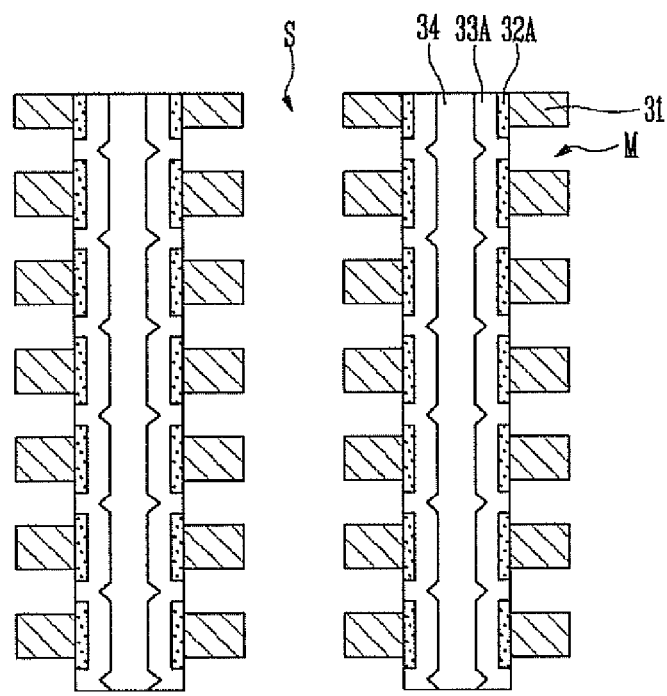

Referring to FIG. 3B, the plurality of protrusions of the first channels 33, which may protrude between the stacked first material layers 31, may be etched. In this case, the memory layer 32 configured to surround the plurality of protrusions may be etched together. Here, regions where the plurality of protrusions and the memory layer 32 are etched (hereinafter, mold regions M) may be required for forming molds used to form subsequent control gates 31.

In this case, the memory layer 32 may be patterned into a plurality of memory layer patterns 32A, which may be respectively interposed in an I-shape between the first channels 33A and the first material layers 31. Accordingly, each memory layer pattern 32A may be separated with a predetermined distance to prevent charges from moving between the memory cells.

Furthermore, the protrusions of the first channels 33A may be removed so that channels of the memory cells do not surround control gates but be formed in straight shapes. Thus, the channel effective length of the memory cells may decrease.

Although not shown in FIG. 3B, after etching the plurality of protrusions and the memory layer 32 configured to surround the protrusions, junctions may be formed by implanting impurities into the first channels 33A exposed between the stacked first material layers 31.

Figure 3C:
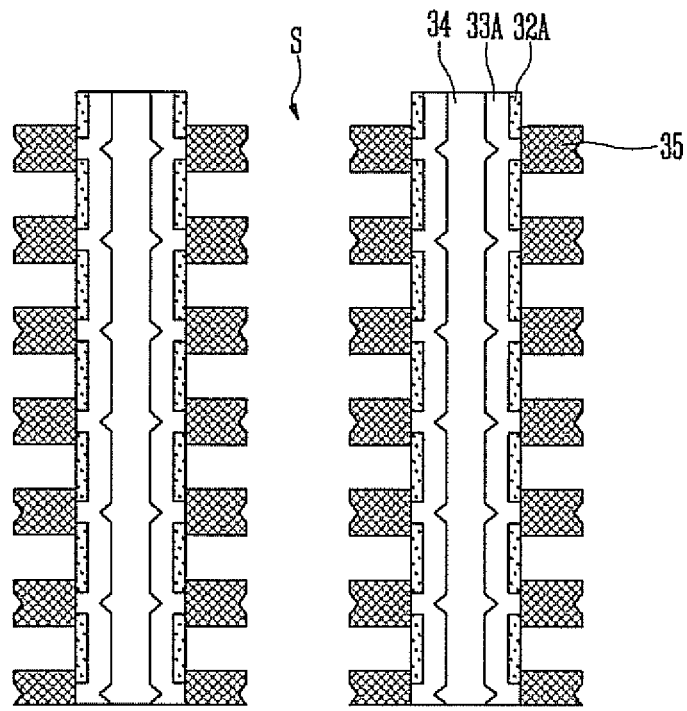

Referring to FIG. 3C, the mold regions 'M' may be filled with an insulating layer, such as an oxide layer. Here, insulating layers formed in the mold regions 'M' may be molds 35 for forming control gates.

Thereafter, the plurality of first material layers 31 may be removed to form a plurality of control gate regions. Here, the plurality of control gate regions may be isolated from one another by the molds 35.

Figure 3D:
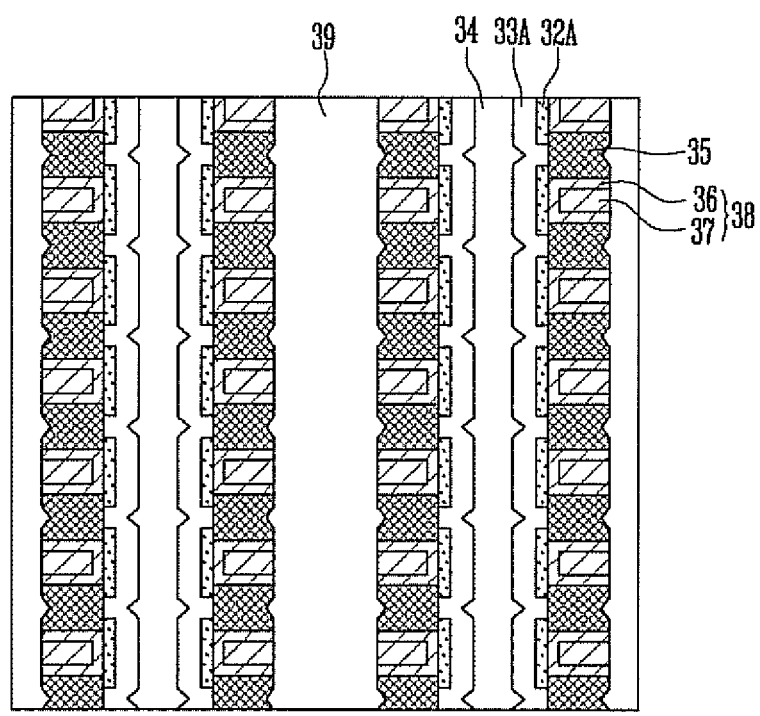

Referring to FIG. 3D, a conductive layer may be formed in the plurality of control gate regions to form a plurality of control gates 38. Each of the control gates 38 may include a first metal layer 36 and a second metal layer 37. The first metal layer 36 may be a barrier metal layer, while the second metal layer 37 may be a gap-fill metal layer.

Thereafter, an insulating layer 39 may be formed in the slits 'S' in which the plurality of control gates 38 are formed. The formation of the memory cells stacked along the first channels 33A may be completed.

In the second embodiment, the first material layers 31 may be a conductive layer for control gates, while the second material layers 32 may be a sacrificial layer. In this case, after performing the processes described with reference to FIGS. 3A and 3B, an insulating layer may be formed in the slits S, and the formation of memory cells stacked along the first channels 33A may be completed. In this case, before forming the insulating layer, the plurality of first material layers 31 exposed to inner walls of the slits S may be silicided.

FIGS. 4A through 4D are cross-sectional views illustrating a method of manufacturing a 3-dimensional nonvolatile memory device according to a third exemplary embodiment of the present invention. In FIGS. 4A to 4D, only a memory cell region is illustrated for brevity.

Figure 4A:
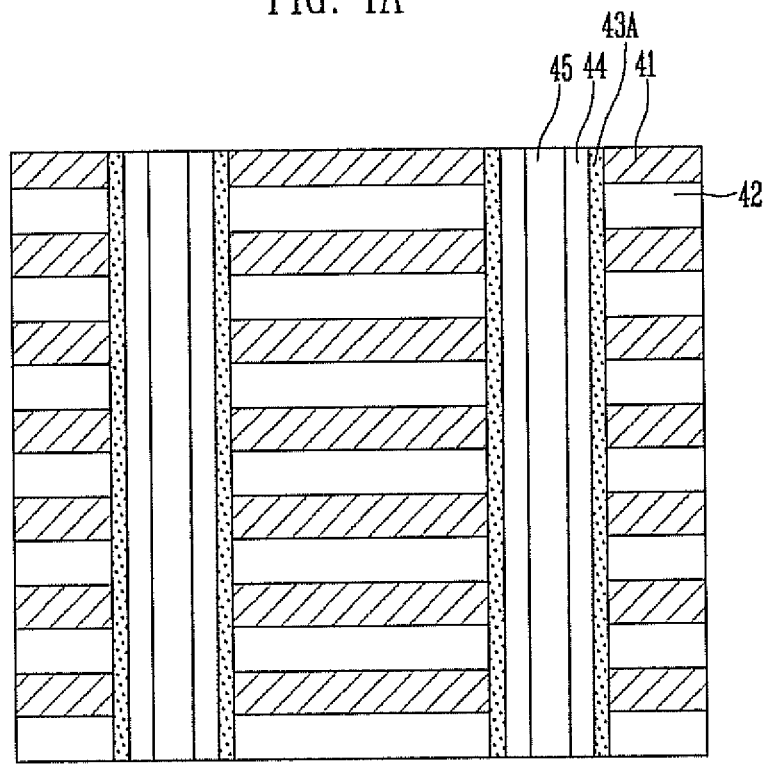
FIGS. 4A through 4D are cross-sectional views illustrating a method of manufacturing a 3-dimensional nonvolatile memory device according to a third exemplary embodiment of the present invention.

Referring to FIG. 4A, a plurality of first material layers 41 and a plurality of second material layers 42 may be alternately formed. Here, the first material layers 41 may be conductive layers for control gates, while the second material layers 42 may be sacrificial layers.

Thereafter, etching the plurality of first material layers 41 and the plurality of second material layers 42 may form a plurality of first trenches. A memory layer 43 may be formed on inner walls of the first trenches. Here, the memory layer 43 may include a charge blocking layer, a charge trap layer, and a tunnel insulating layer.

Thereafter, a channel layer may be formed on the memory layer 43 to form first channels 44 passing through the plurality of first material layers 41 and the plurality of second material layers 42. In this case, when the first channels 44 have a structure to open central regions of the first channels 44, deposting an insulating layer 45 may to fill in the open central regions.

Figure 4B:
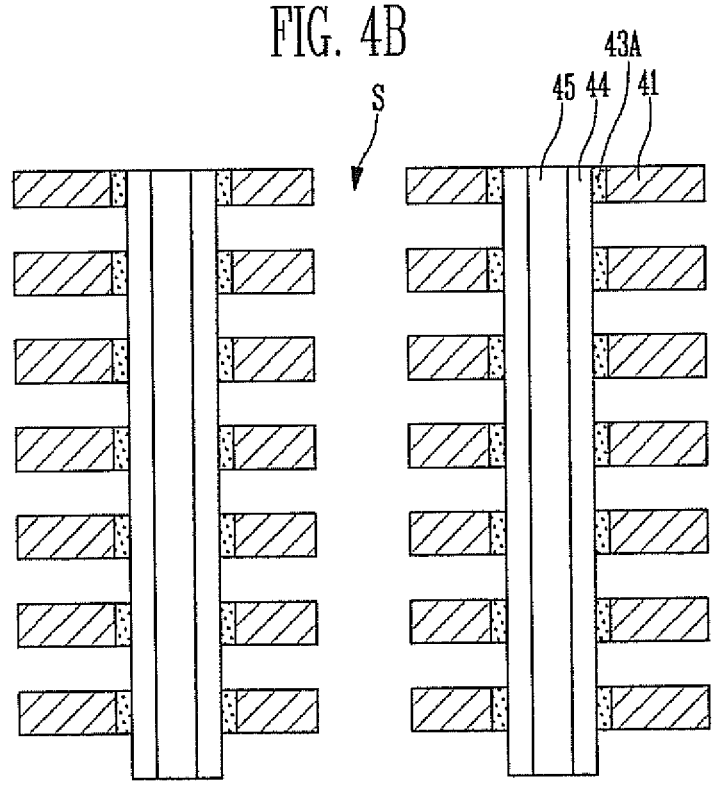

Referring to FIG. 4B, the plurality of first material layers 41 and the plurality of second material layers 42 may be etched to form slits 'S' between adjacent first channels 44. Thereafter, the plurality of second material layers 42 exposed in the slits 'S' may be etched.

Thereafter, etching the plurality of second material layers 42 may be to expose a part of the memory layer 43. In this case, etching the exposed memory layer 43 may split the memory layer 43 into a plurality of memory layer patterns 43A, which may locate only between each first channel 44 and each first material layers 41.

Figure 4C:
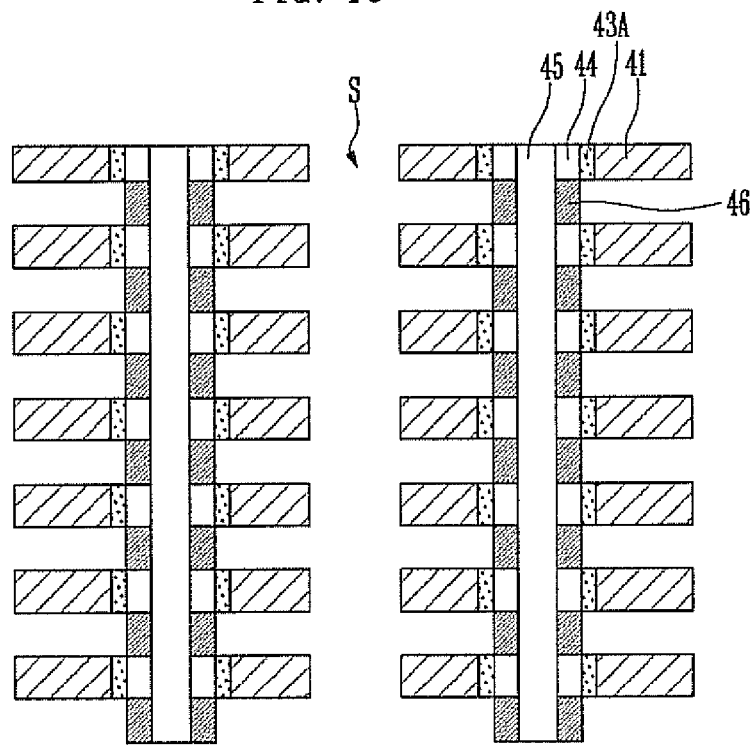

Referring to FIG. 4C, impurities may be implanted into the first channels 44 exposed between the memory layer patterns 43A, thereby forming junctions 46. In an example, the junctions 46 may be formed by implanting ions in a lateral direction. In another example, the formation of the junctions 46 may include forming doped third material layers (not shown) and diffusing impurities of the third material layers into the exposed first channels 44 using an annealing process. In this case, after forming the junctions 46, the third material layers may be removed.

As a result, the first channels 44A may include a plurality of junctions 46 formed between the stacked first material layers 41. The junctions 46 may be respectively disposed between the stacked memory cells. Accordingly, the junctions 46 may be provided in the first channels 44A between the stacked memory cells so that the memory device may be driven in an enhanced mode.

Figure 4D:
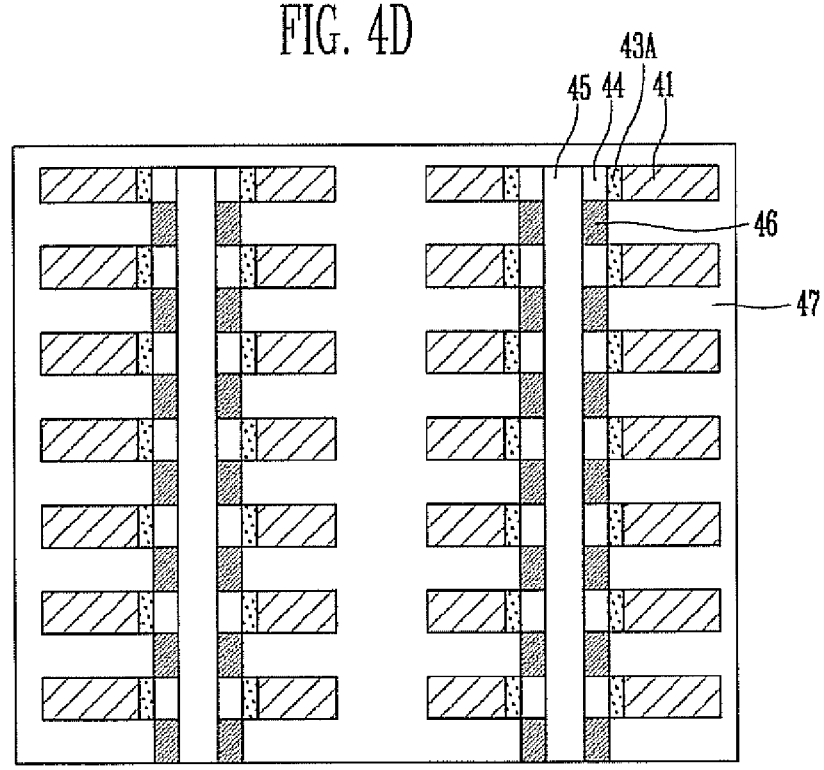

Referring to FIG. 4D, an insulating layer 47 may be formed in the slits 'S' in which the junctions 46 are formed, thereby completing the formation of the memory cells stacked along the first channels 44A.

Figure 5:
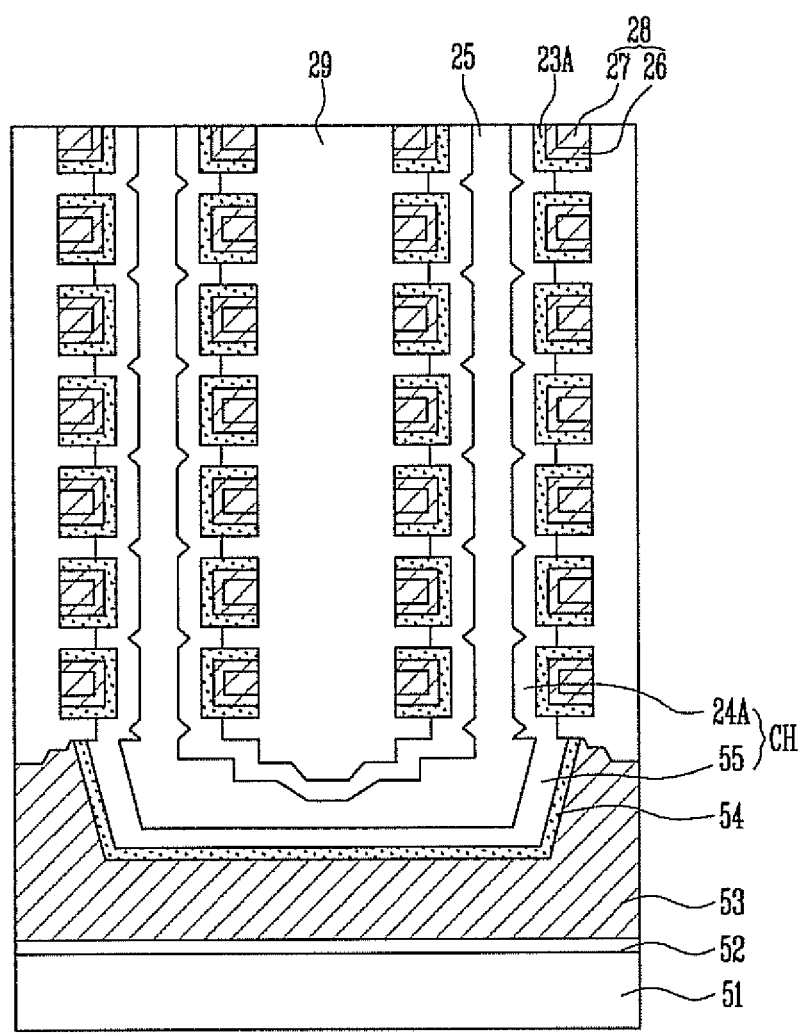
FIG. 5 is a cross-sectional view of a structure of a 3-dimensional nonvolatile memory device including memory cells according to the first exemplary embodiment.

FIG. 5 is a cross-sectional view of a structure of a 3-dimensional nonvolatile memory device including memory cells according to the first embodiment.

Referring to FIG. 5, the memory device may include an interlayer insulating layer 52 formed on a substrate 51, a pipe gate 53 formed on the interlayer insulating layer 52, a second channel 55 formed in the pipe gate 53 and connected to a pair of first channels 24A. Here, one pair of first channels 24A and one second channel 55 may be connected in a U-shape and constitute one string channel CH. Also, the memory device may further include a gate insulating layer 54 configured to surround the second channel 55.

The gate insulating layer 54 may be formed during formation of a memory layer 23, while the second channel 55 may be formed during the formation of the first channels 24A.

For example, before forming a plurality of material layers and a plurality of second material layers, the pipe gate 53 may be etched to form a second trench in a position connected to a pair of first trenches, and a sacrificial layer may be formed in the second trench. After forming the plurality of first trenches, the sacrificial layer may be removed to form a U-shaped trench including a pair of first trenches and a second trench. Thereafter, as described in the first embodiment, the memory layer 23 and a channel layer may be formed. In this case, the memory layer 23 and the channel layer may be formed in the U-shaped trench.

When the memory cells are formed using the above-described method, the memory layer 23 surrounding the second channel 55 may be separated from the memory layer 23 surrounding the first channels 24A during the etching of the memory layer 23 to form the plurality of memory layer patterns 23A. Here, the memory layer patterns 23A surrounding the first channels 24A may respectively surround a plurality of control gates 28 in an angled C-shape. The memory layer patterns 23A might be separated from one another. Also, the memory layer patterns 23A surrounding the second channel 55 may surround sidewalls and bottom surface of the second channel 55 in a U-shape, and serve as the gate insulating layer 54.

Therefore, according to the present invention, charge trap layers of the stacked memory cells may be isolated from one another. The memory layer pattern 23A of the lowermost memory cell may be separated from the gate insulating layer 54 of the pipe gate 53.

After forming the control gates 28, connections between the first channels 24A and the second channel 55 exposed in a slit 'S' may be etched during the etching of protrusions of the first channels 24. Accordingly, an etching process may be controlled to prevent the first channels 24A from being separated from the second channel 55 due to the complete etching of the connections between the first channels 24A and the second channel 55.

Alternatively, a protection layer may be formed on bottom surfaces of slits 'S' prior to a protrusion etching process. For example, the protection layer may have substantially the same height with the control gate of the lowermost memory cell, in order to cover the connections between the first channels 24A and the second channel 55 through the bottom surfaces of the slits 'S.' On the other hands, an etching depth for the slits 'S' may be controlled in a range of completely exposing the first material layers 21 but not etching the lowermost second material layer 22. In this case, the connections between the first channels 24A and the second channel 55 may be not exposed during the protrusion etching process. In addition, the width of the pipe trench may be reduced not to expose the connections between the first channels 24A and the second channel 55.

Although not shown in FIG. 5, after filling the second trench with the sacrificial layer, the pipe gate 53 may be further formed. In this case, the gate insulating layer 54 formed on the second channel 55 may be maintained. The gate insulating layer 54 may be maintained using the same method as the above-described method of preventing the etching of the connections between the first channels 24A and the second channel 55. By further forming the pipe gate to cover the second channel 54, a cell current supplied to the second channel 54 may be improved to improve the performance of the memory device.

Figure 6:
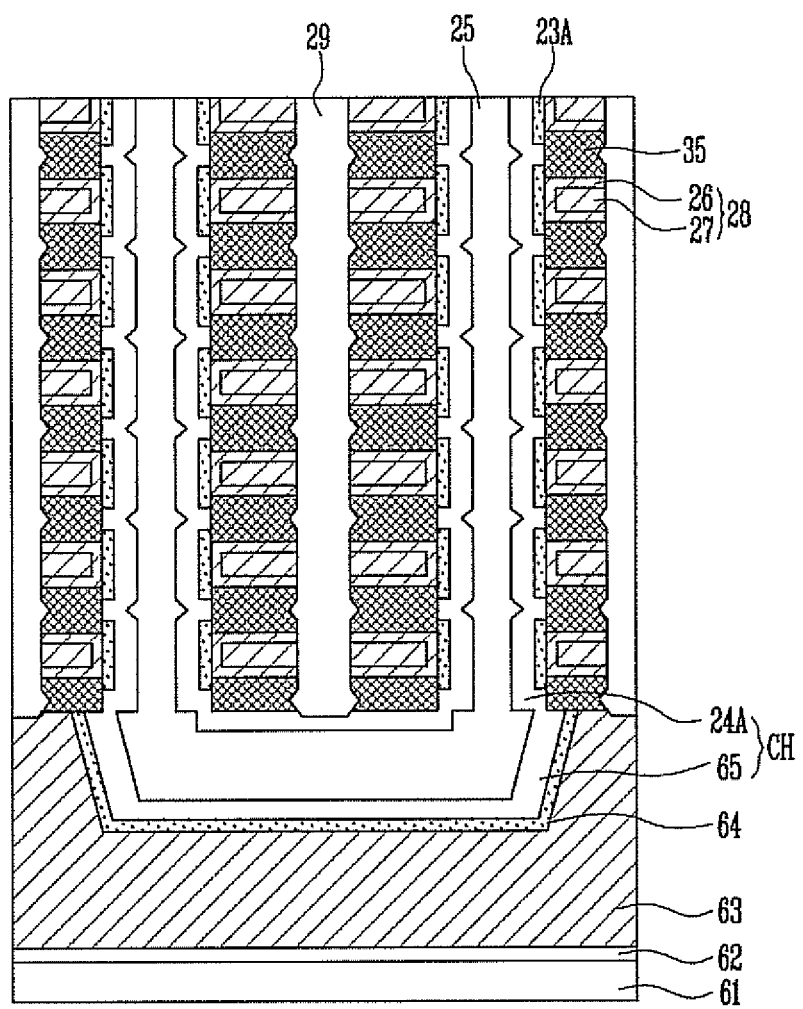
FIG. 6 is a cross-sectional view of a structure of a 3-dimensional nonvolatile memory device including memory cells according to the second embodiment.

FIG. 6 is a cross-sectional view of a structure of a 3-dimensional nonvolatile memory device including memory cells according to the second exemplary embodiment.

Referring to FIG. 6, the memory device may include an interlayer insulating layer 62 formed on a substrate 61, a pipe gate 63 formed on the interlayer insulating layer 62, a second channel 65 formed in the pipe gate 63 and connected to a pair of first channels 24A, and a gate insulating layer 64 configured to surround the second channel 65.

One pair of first channels 24A and one second channel 65 may be connected in a U-shape and constitute one string channel CH. Also, memory layer patterns 23A may be respectively interposed in an I-shape between a plurality of control gates and the first channels 24A.

Figure 7:
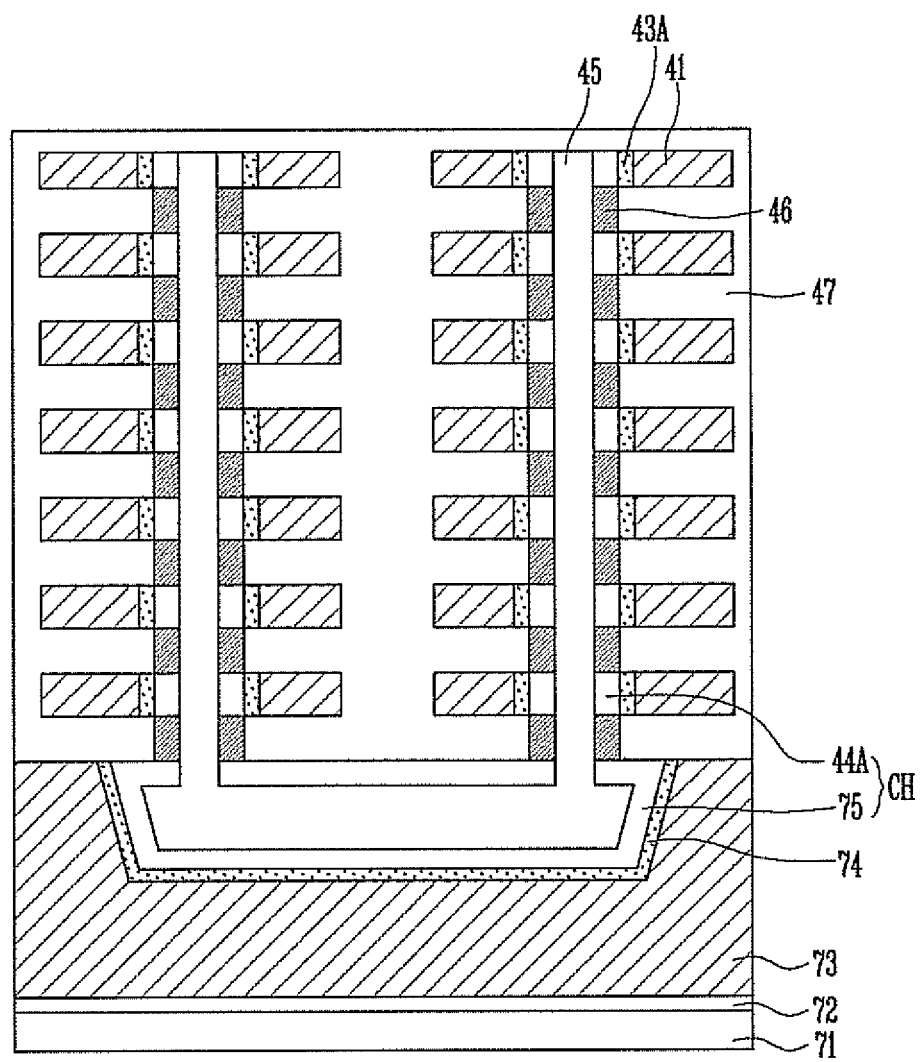
FIG. 7 is a cross-sectional view of a structure of a 3-dimensional nonvolatile memory device including memory cells according to the third exemplary embodiment.

FIG. 7 is a cross-sectional view of a structure of a 3-dimensional nonvolatile memory device including memory cells according to the third exemplary embodiment.

Referring to FIG. 7, the memory device may include an interlayer insulating layer 72 formed on a substrate 71, a pipe gate 73 formed on the interlayer insulating layer 72, a second channel 75 formed in the pipe gate 73 and connected to a pair of first channels 74A, and a gate insulating layer 74 configured to surround the second channel 75.

One pair of first channels 24A and one second channel 75 may be connected in a U-shape and constitute one channel CH. Also, memory layer patterns 43A may be respectively interposed in an I-shape between a plurality of control gates and the first channels 24A. In addition, junctions 46 may be disposed in first channels 44A between stacked memory cells.

Figure 8:
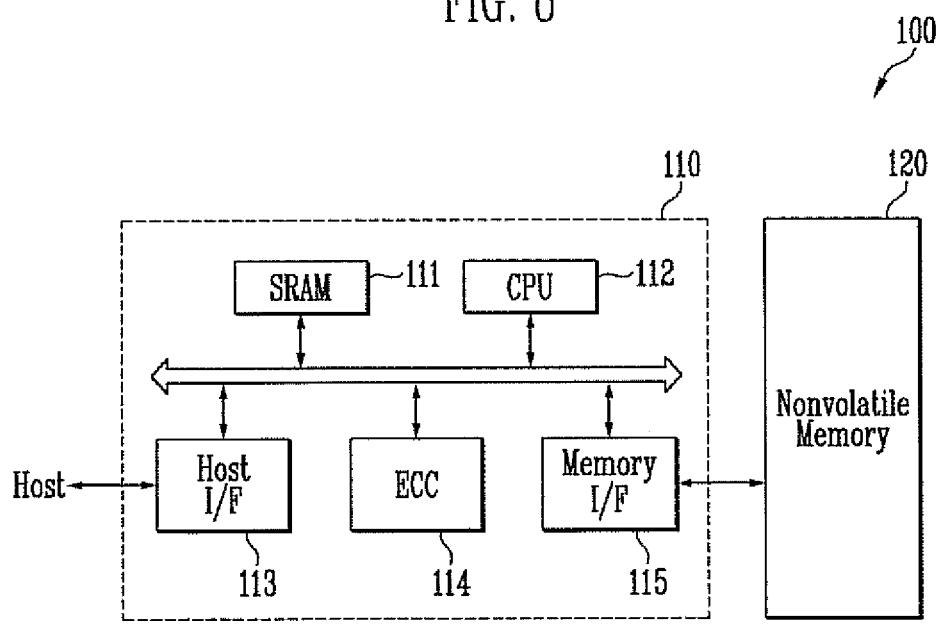
FIG. 8 is a configuration diagram of a memory system according to an exemplary embodiment of the present invention.

FIG. 8 is a configuration diagram of a memory system 100 according to an exemplary embodiment of the present invention.

Referring to FIG. 8, the memory system 100 may include a nonvolatile memory device 120 and a memory controller 110.

The nonvolatile memory device 120 may be formed to have the above-described cell structure. Also, the nonvolatile memory device 120 may be a multi-chip package (MCP) including a plurality of flash memory chips.

The memory controller 110 may be configured to control the nonvolatile memory device 120 and include a static random access memory (SRAM) 111, a central processing unit 112, a host interface 113, an error correction code (ECC) unit 114, and a memory interface 115. The SRAM 111 may be used as an operation memory of the CPU 112. The CPU 112 may perform the overall control operation for exchanging data of the memory controller 110. The host interface 112 may include a data exchange protocol of a host connected to the memory system 100. Further, the ECC unit 114 may detect and correct errors in data read from the nonvolatile memory device 120. The memory interface 115 may interface with the nonvolatile memory device 120. In addition, the memory controller 110 may include a read context manager (RCM) configured to store code data required for interfacing with the host.

The memory system 100 having the above-described construction may be a memory card or solid-state disk (SSD) having operational characteristics of both the nonvolatile memory device 120 and the memory controller 110. For example, when the memory system 100 is an SSD, the memory controller 110 may communicate with the outside (e.g., the host) through one of various interface protocols, such as a universal serial bus (USB), a man machine communication (MMC), a peripheral component interconnect-express (PCI-E), a serial advanced technology attachment (SATA), a parallel advanced technology attachment (PATA), a small computer system interface (SCSI), an enhanced small device interface (ESDI), or an intelligent drive electronics (IDE).

Figure 9:
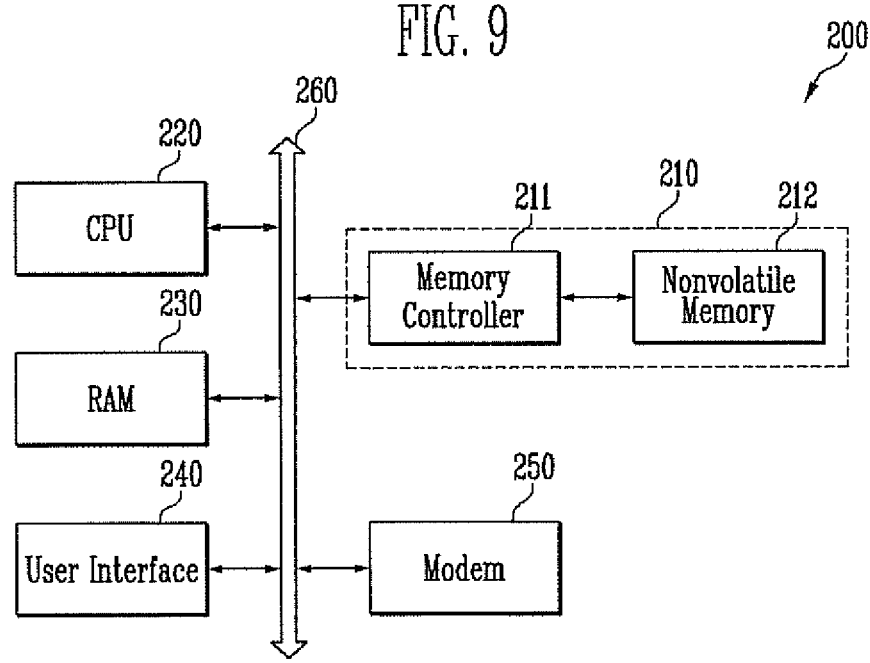
FIG. 9 is a configuration diagram of a computing system according to an exemplary embodiment of the present invention.

FIG. 9 is a configuration diagram of a computing system 200 according to an exemplary embodiment of the present invention.

Referring to FIG. 9, the computing system 200 according to the embodiment of the present invention may include a CPU 220, a random access memory (RAM) 230, a user interface 240, a modem 250, and a memory system 210, which may be electrically connected to each other through a system bus 260. When the computing system 200 is a mobile device, the computing system 200 may further include a battery configured to supply an operating voltage to the computing system 200. The computing system 200 may further include an application chipset, a camera image processor (CIS), and a mobile dynamic random access memory (mobile DRAM).

As described with reference to FIG. 8, the memory system 210 may include a nonvolatile memory 212 and a memory controller 211.

According to the present invention, charge trap layers of stacked memory cells may be isolated from one another. Accordingly, interferences between selection gates as well as between memory cells may be reduced, thereby improving the efficiency of program, erase, and read operations. Furthermore, junctions may be formed in channels between stacked control gates so that a memory device may be driven in an enhanced mode.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a nonvolatile memory device, comprising:
    alternately forming first material layers and second material layers;
    etching the first material layers and the second material layers to form first trenches;
    etching the second material layers exposed in the first trenches;
    forming a charge trap layer along inner surfaces of the first trenches in which the second material layers are etched;
    forming a channel layer on the charge trap layer to form first channels having protrusions protruding between the stacked first material layers;
    etching the first material layers and the second material layers to form slits between adjacent first trenches;
    etching the charge trap layer exposed in the slits to isolate the charge trap layer of stacked memory cells from one another; and
    forming an insulating layer in the slits in which the charge trap layer is etched.

2. The method of claim 1, wherein when the second material layers remain on the inner walls of the slits, the etching of the charge trap layer is performed after removing the remaining second material layers.

3. The method of claim 1, further comprising, forming junctions in the protrusions exposed between the first material layers after the etching of the charge trap layer.

4. The method of claim 1, further comprising, etching the protrusions exposed between the first material layers after the etching of the charge trap layer.

5. The method of claim 4, further comprising, forming junctions in the first channels exposed between the first material layers after the etching of the protrusions.

6. The method of claim 1, further comprising:
forming control gate regions by removing the first material layers exposed in the slits, after the etching of the charge trap layer; and
forming control gates by forming a conductive layer in the control gate regions.

7. The method of claim 6, wherein the forming of the control gates comprises:
forming a first metal layer and a second metal layer in the slits in which the control gate regions are formed;
etching the second metal layer formed in the slits except the control gate regions, using a combination of a wet etching process and a dry etching process; and
etching the first metal layer formed in the slits except the control gate regions, using a cleaning process.

8. The method of claim 1, wherein the etching of the charge trap layer comprises etching the protrusions and the charge trap layer surrounding the protrusions to form mold regions.

9. The method of claim 8, further comprising:
filling the mold regions with an insulating layer to form molds required for forming the control gates, after the etching of the charge trap layer;
removing the first material layers to form the control gate regions; and
forming a conductive layer in the control gate regions to form the control gates.

10. The method of claim 9, wherein the forming of the control gates comprises:
forming a first metal layer and a second metal layer in the slits in which the control gate regions are formed;
etching the second metal layer formed in the slits except the control gate regions, using a combination of a wet etching process and a dry etching process; and
etching the first metal layer formed in the slits except the control gate regions, using a cleaning process.

11. The method of claim 1, further comprising:
etching a pipe gate to form a second trench in a position connected to a pair of first trenches, before forming the first material layers and the second material layers;
forming a sacrificial layer in the second trench; and
removing the sacrificial layer after the forming of the first trenches.

12. The method of claim 1, wherein the first material layers and the second material layers are formed of materials having a high etch selectivity ratios against each other.

* * * * *